(12) United States Patent
Ito et al.

(10) Patent No.: US 6,539,929 B2
(45) Date of Patent: Apr. 1, 2003

(54) IGNITION DEVICE FOR AN INTERNAL COMBUSTION ENGINE

(75) Inventors: Takashi Ito, Naka-machi (JP); Katsuaki Fukatsu, Urizura-machi (JP); Ryoichi Kobayashi, Tokai-mura (JP); Noboru Sugiura, Mito (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/758,394

(22) Filed: Jan. 12, 2001

(65) Prior Publication Data
US 2001/0007252 A1 Jul. 12, 2001

(30) Foreign Application Priority Data
Jan. 12, 2000 (JP) ........................................ 2000-006253

(51) Int. Cl.$^7$ ................................................ F02P 11/00
(52) U.S. Cl. ..................... 123/630; 123/644; 315/209 T
(58) Field of Search .......................... 123/146.5 D, 630, 123/632, 644; 315/209 T

(56) References Cited

U.S. PATENT DOCUMENTS 5,664,550 A  * 9/1997 Ito et al. ...................... 123/630

FOREIGN PATENT DOCUMENTS

JP          8-335522        12/1996

* cited by examiner

Primary Examiner—Willis R. Wolfe
Assistant Examiner—Johnny H. Hoang
(74) Attorney, Agent, or Firm—Crowell & Moring LLP

(57) ABSTRACT

A one-chip integration circuit including a power part and a control part integrated within an IGBT monolithic silicon substrate is disclosed. The control circuit part comprises a current limiting circuit for limiting a current so that it does not flow over a set-up value, a reference pulse generating circuit for detecting that an ignition control signal is inputted over a predetermined period of time, a digital timer made up by a digital counter, a latch circuit for dropping the gate voltage of the IGBT by latching due to the digital timer output signal and carrying out resetting when the ignition control signal is off, an input circuit having a potential comparison circuit in its input stage, in which the operation voltage for ignition control signal has a threshold value and a hysterisis, and an input protection circuit having a Zener diode and a resistor connected in parallel therewith for protecting the element from disturbance surges. A one-chip igniter with high operative stability and high reliability can be provided.

8 Claims, 8 Drawing Sheets

IGNITION DEVICE FOR AN INTERNAL COMBUSTION ENGINE

BACKGROUND OF THE INVENTION

This invention relates to an ignition device adapted to be used for an internal combustion engine.

In the prior art field, there is an ignition device for an internal combustion engine in which a power switching part, a current limiting circuit acting as a protection function part, and a thermal shut-off circuit for forcing current flow to be blocked out at the time of abnormal heating are integrated on the monolithic silicon substrate of an IGBT, as shown in Japanese Patent Prepublication No. 335522/1986.

This prior art includes the current limiting circuit and thermal shut-off circuit acting as protection functions in an igniter, but since the thermal shut-off circuit has the function such that it detects abnormal current flow indirectly by monitoring the temperature of an element to force the gate signal of an IGBT to become low when the element temperature reached an established temperature, thereby to intercept the primary current flowing through an ignition coil, it is impossible to control the timing of generating electrical discharge at an ignition plug due to a high voltage at the secondary side of the ignition coil and there is a possibility that burning such as backfire, etc. occurs due to ignition during the intake stroke.

SUMMARY OF THE INVENTION

In order to resolve the above-mentioned problem of the prior art, this invention provides a latch control system having a timer for counting the on-time of an ignition controlling signal to detect directly the current flowing time thereby to force the primary current to be blocked in case where the ignition controlling signal of which duration is longer than a definite period of time is inputted and further to interrupt the current through the IGBT until this ignition controlling signal becomes low. Also, an electric potential comparison circuit is provided in the input stage, the operative voltage for the ignition controlling signal is used which has a threshold value and a hysterisis, and an NMOS transistor is formed within the self-separation layer in which these control circuits and the power IGBT part are isolated by a p-well layer.

As mentioned abode, with the latch control system having a timer for counting the on-time of an ignition controlling signal to detect directly the current flowing time thereby to force the primary current to be blocked in case where the ignition controlling signal of which duration is longer than a definite period of time is inputted and further to interrupt the current through the IGBT until this ignition controlling signal becomes low, it is possible to control the timing of the compelled blocking. Since the current flowing is not restarted during the abnormal current flowing condition once it is operated, it is possible to prevent the burning of the backfire, etc. Also, by providing the electric potential comparison circuit in the input stage and using the operative voltage for the ignition controlling signal having the threshold value and the hysterisis, it is possible to provide a large margin for external noises. Further, with the NMOS transistor formed within the self-separation layer in which the control circuits and power IBGT part are isolated by the p-well layer, it is possible to integrate them on the monolithic silicon substrate of the IGBT with the minimum number of processes, and to achieve a multifunctional one-chip igniter with high operative stability and reliability.

DETAILED DESCRIPTION OF THE PREFERRED EMBODIMENTS

Figure 1:
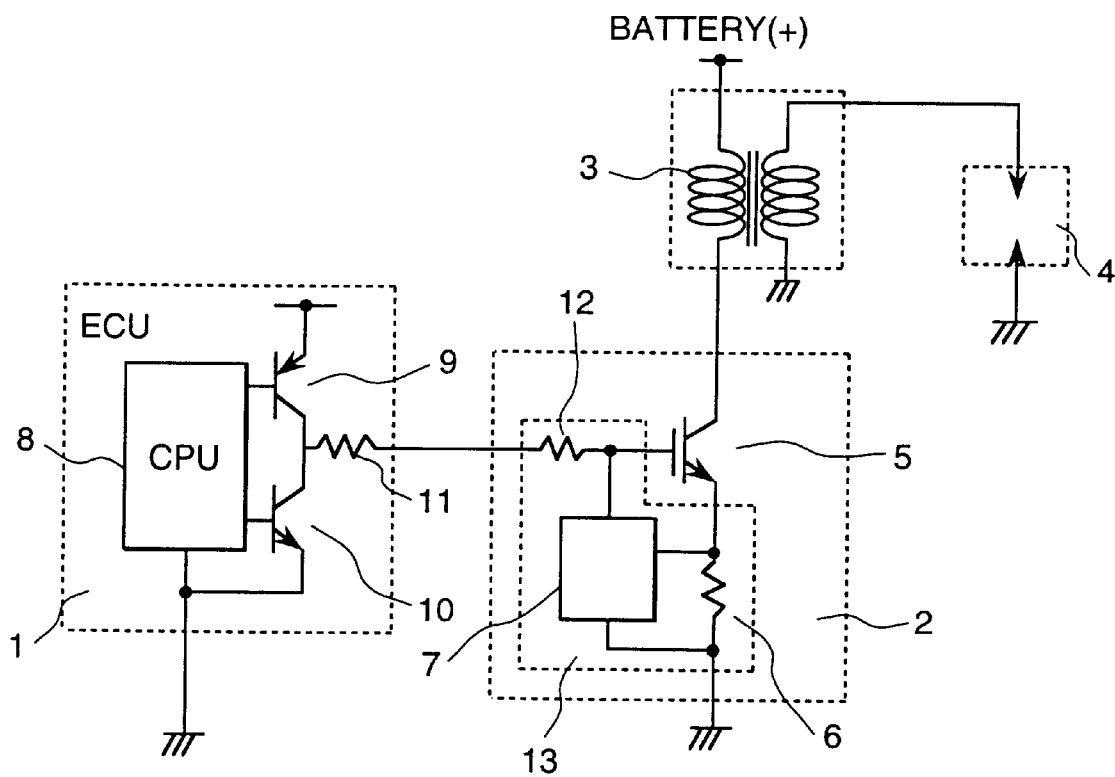
FIG. 1 shows a usual ignition device.

FIG. 1 shows one example of a usual ignition system. Reference numeral 1 identifies an ECU, 2 an ignition device, 3 an ignition coil and 4 an ignition plug. The output stage of the ECU comprises a PNP transistor 9, an NPN transistor 10 and a resistor 11. A CPU 8 computes a proper ignition timing for turning on and off the transistors 9 and 10 to output pulses of HIGH and LOW to an ignition device 2. The ignition device 2 comprises a power transistor 5, a load 6 for sensing a current which is mounted in a hybrid IC 13, a current control circuit 7 and an input resistor 12. When the output signal of the ECU changes LOW to HIGH, the power transistor 5 starts its current flowing and at the time of HIGH to LOW it block the currents flowing, whereby the collector of the power transistor 5 generates a voltage and this voltage produces at the secondary side of the ignition coil a high voltage corresponding to the collector voltage by the turn ration of the ignition coil. Since this voltage generated at the secondary side of the ignition coil (hereinafter, referred to a secondary voltage) changes depending to the operative conditions of the engine, the voltage generated the collector part also changes, but in case where the secondary voltage of an ignition coil having the turn ration of 100, for example, is 15 kV, the voltage of about 150 V is generated at the collector part.

Figure 2:
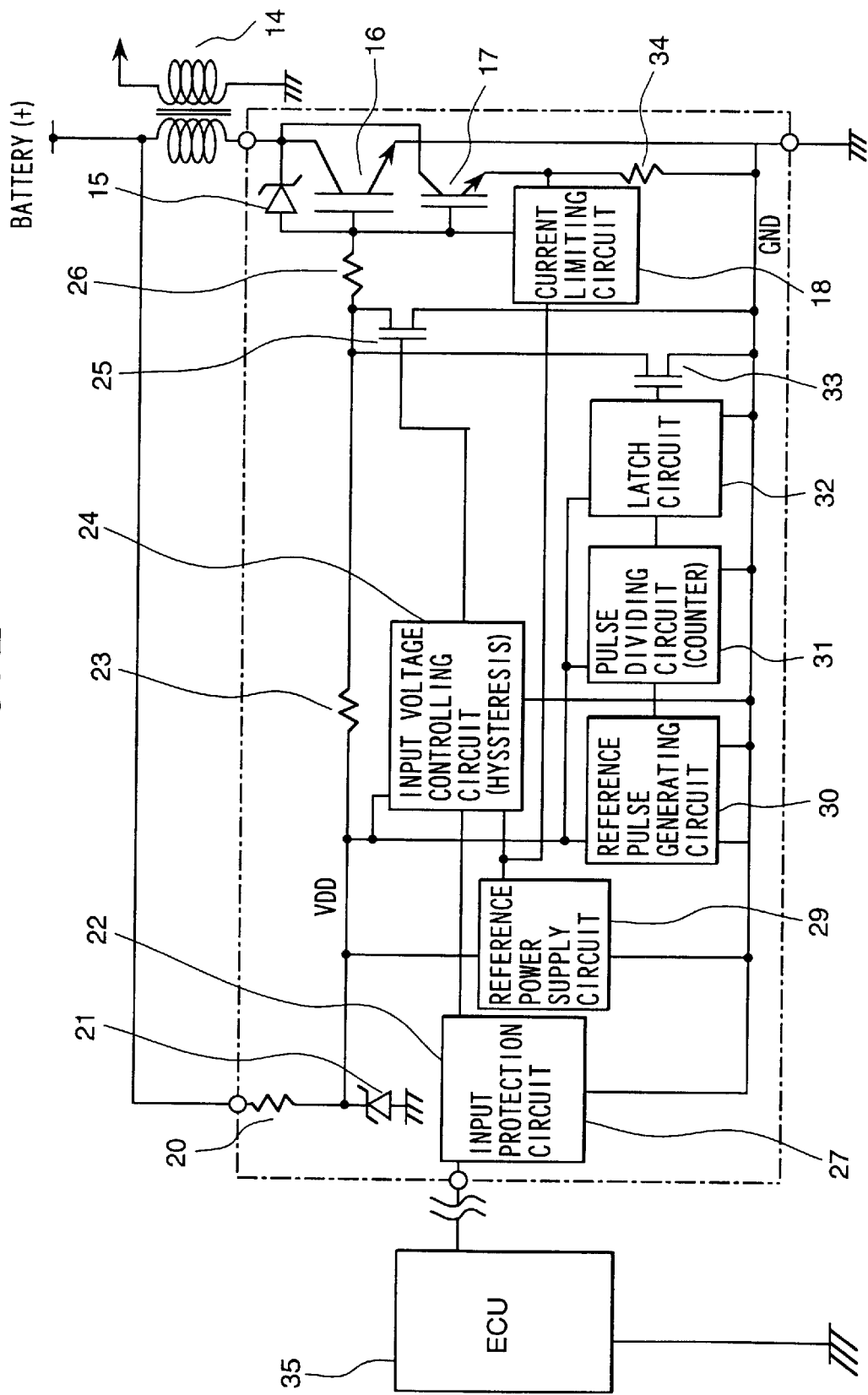
FIG. 2 is a block diagram identifying an embodiment of this invention.

FIG. 2 shows a block diagram of an ignition device according to one embodiment of this invention. Reference numeral 14 is an ignition coil, 15 a main IGBT consisting of the main circuit for flowing or blocking the primary current through the primary coil of the ignition coil, 16 a sense IGBT consisting of a shunt circuit for detecting the current flowing through the IGBT and 18 a current limiting circuit consisted of a voltage comparison circuit. The power supply for the control part is supplied by a battery, and a circuit power supply voltage VDD is created by a resistor 20 and a Zener diode, said circuit power supply voltage VDD being supplied to the gates of the IGBT through resistors 23 and 26. The input stage of the ignition device which is connected to the ECU comprises an input protection circuit for the protection from an external serge and the prevention of IGBT latch up arising from the external serge, which is connected to an input voltage control circuit 24 made up a voltage comparison circuit having a hysterisis. The input voltage control circuit 24 controls a transistor 25 on the basis of the input signal level, thereby to carry out the current flowing and blocking control by controlling the gate voltage for the IGBTs. The resistor 23 functions to maintain the VDD voltage even when the transistor 25 is turned on, and the resistor 26 functions to decrease the Zener current at the time when the IGBT protecting Zener 15 operates and to decrease the serge which gets into the gate. A reference power supply circuit 29 acts as a comparison reference voltage source for the input voltage control circuit 24 and the current limiting circuit 18 which compare this reference voltage with detected voltages. A pulse generating circuit 30, a pulse dividing circuit 31 and a latch circuit 32 make up a self shut-off circuit for preventing continuous current flowing. The pulse generating circuit 30 acts as an astable pulse generating circuit for generating the reference pulse signal at the same time when the VDD power supply is actuated, the pulse dividing circuit 31 frequency-dividing this pulse signal operates as a timer for counting a predetermined time, and the latch circuit 32 holding the output of the timer generates an output by which a transistor 33 is operated to control the gate voltage of the IGBTs.

Figure 3:
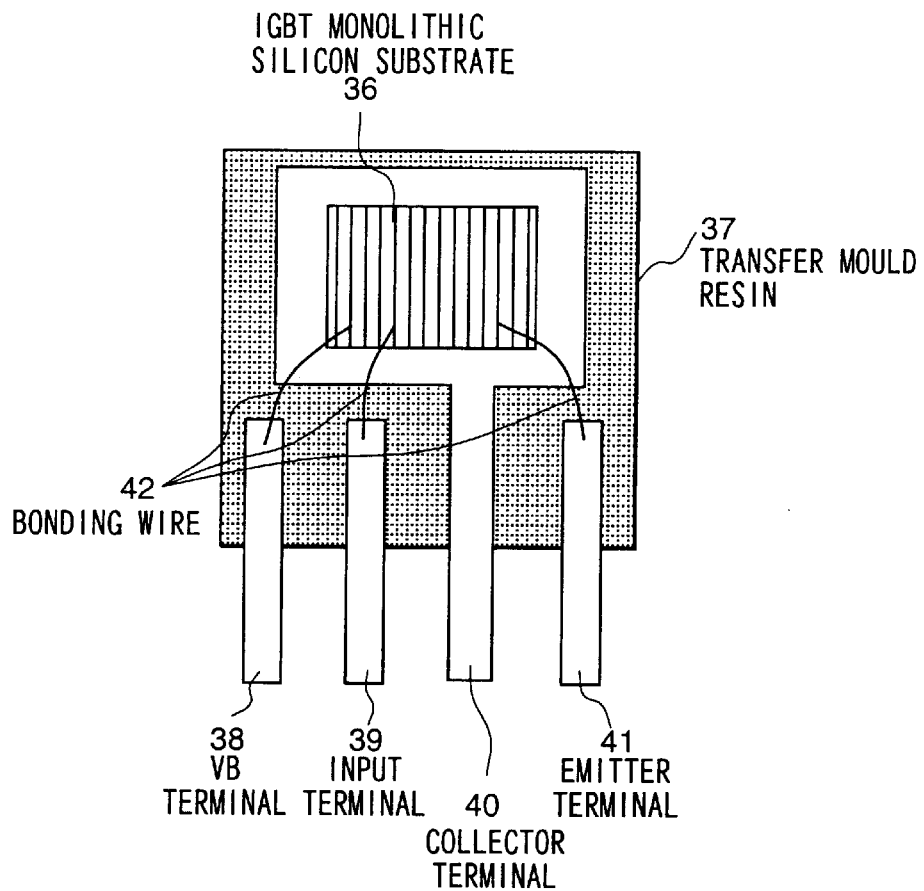
FIG. 3 is a diagram for explaining a package of this invention.
Figure 4:
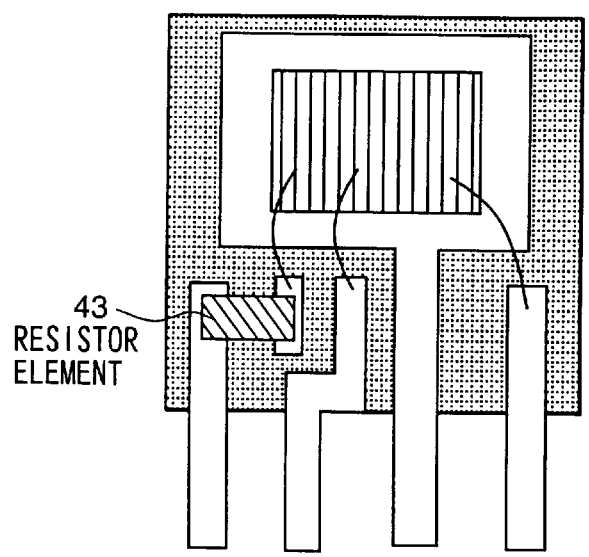
FIG. 4 shows one example in which a resistor is connected between a battery and a control circuit.

FIG. 3 shows an example of the mounting structure of this invention. An IGBT monolithic silicon substrate 36 is soldered to a base plate acting as a collector terminal 40, a VB terminal 38, an input terminal 39 and an emitter terminal 41 are bonded the substrate via respective bonding wires, and transfer mould resin 37 is used to form a package for these. The resistor 80 and Zener diode 81 for said circuit power supply voltage VDD, which are of a built-in type have sufficient withstanding-amounts for automobile usage, but recently such a specification that a test is carried out by applying an overmuch serge to a power supply has been required in the light of the improvement of reliability, and in that case it can be considered that the built-in elements cannot bear such requirement. In order to cope with this, as is shown in FIG. 4, a resistor element 43 may be provided between the VB terminal and VB bonding wire which are at the outside of the monolithic silicon substrate.

Figure 6:
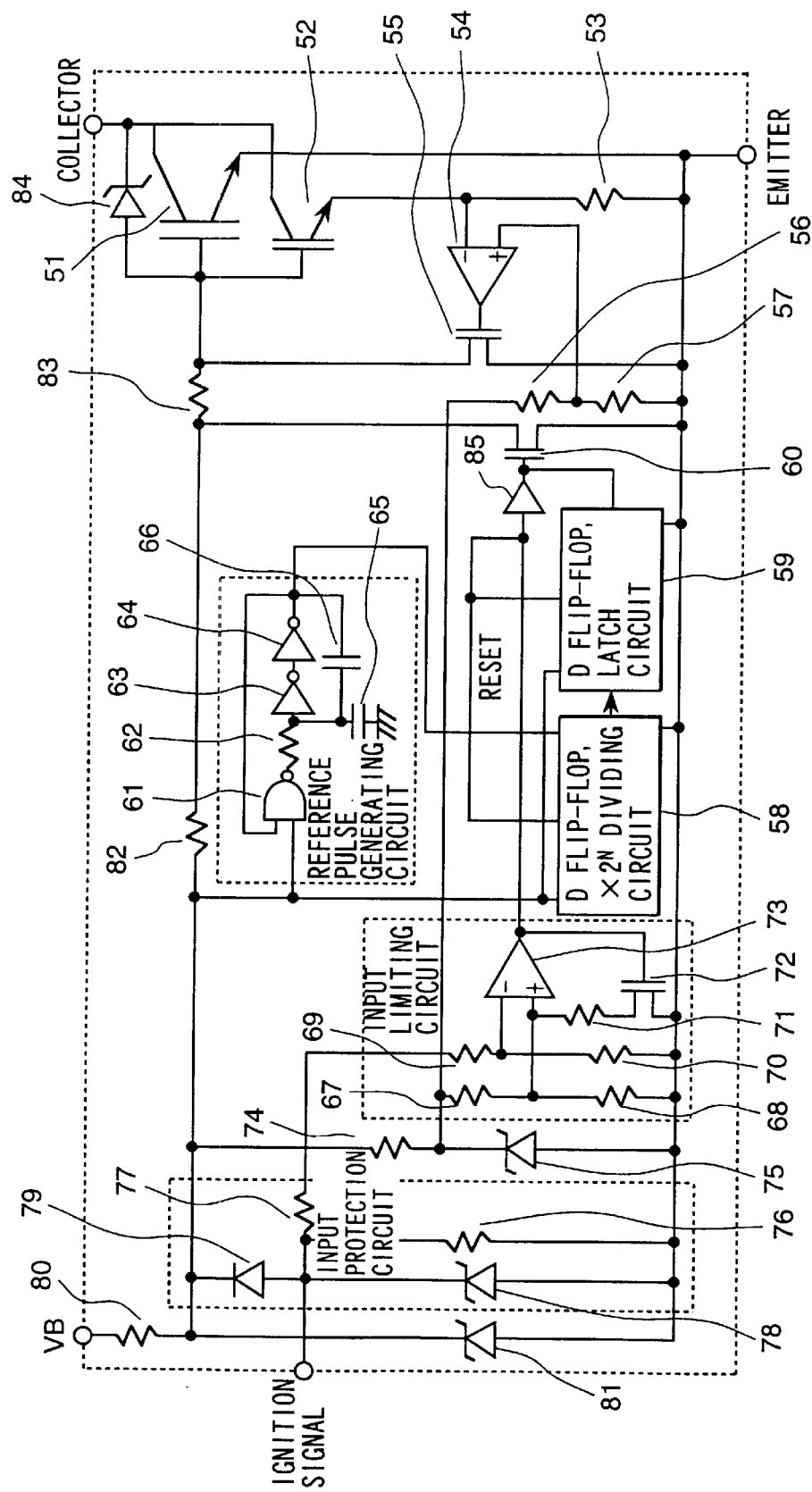
FIG. 6 is a block diagram for explaining an embodiment of this invention and its operation.
Figure 7:
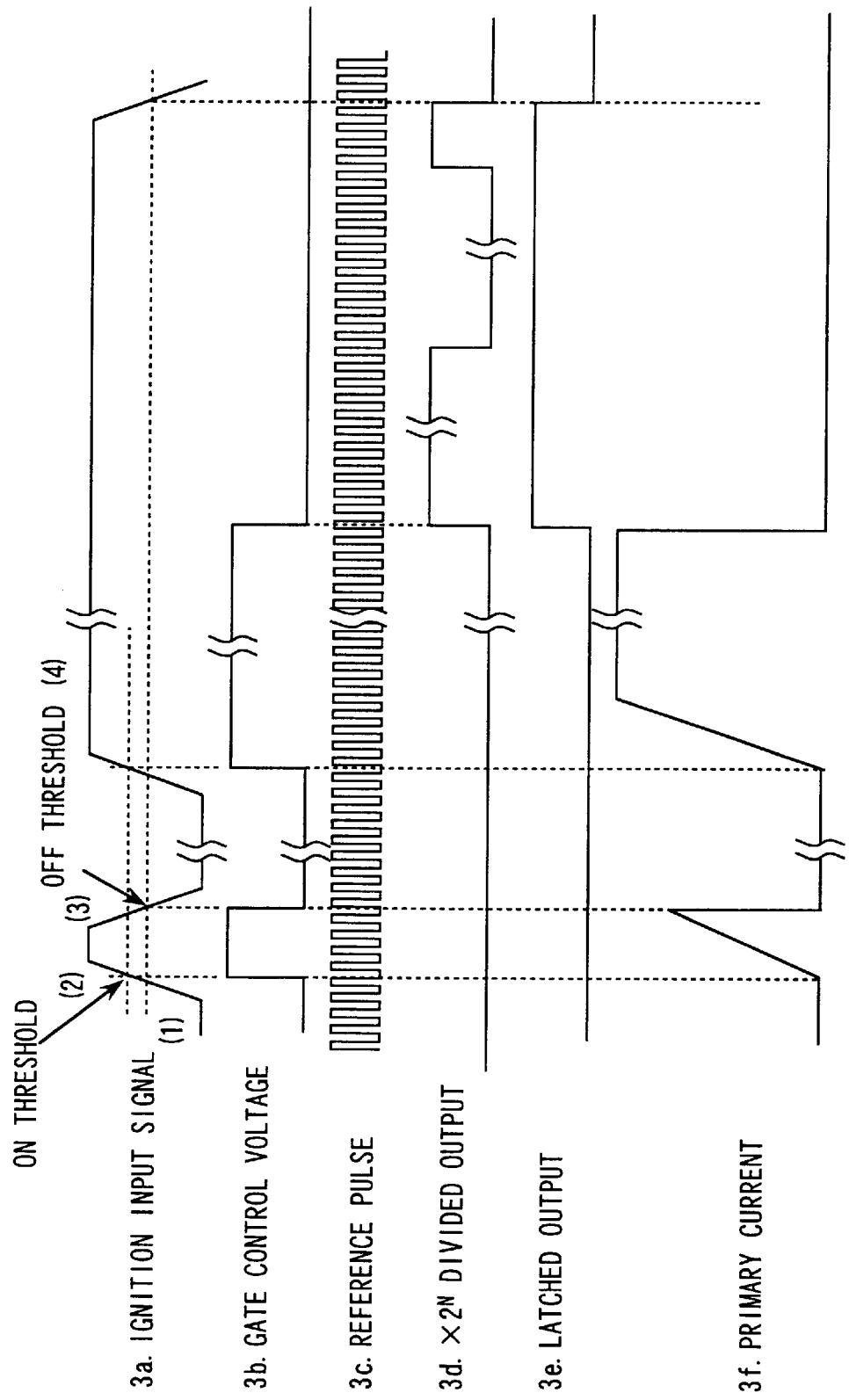
FIG. 7 shows an operative sequence identifying an embodiment of this invention.

FIG. 6 is a view for explaining the circuit arrangement of one embodiment according to this invention. The power supply for the circuit is supplied from a battery voltage VB, and the circuit voltage VDD is obtained by the resistor 80 and the Zener diode 81. These resistor 80 and Zener diode 81 have withstanding-amounts which can bear a serge applied to the power supply of the ignition device for an automobile. There are provided as IGBTs a main IGBT 51 acting as a power part and a sub IGBT 52 for flowing a shunt current, a resistor 53 acting as an impedance element is connected to the emitter of the sub IGBT, a voltage comparison circuit 54 compares the voltage drop generated across the resistor 53 with a set-up value obtained by the division of a reference voltage by means of resistors 56 and 57, and current limitation is effected by turning on a transistor 55 when the voltage drop across the resistor reaches this set-up value, thereby to decrease the gate voltage for the IGBTs to render IGBTs an unsaturated condition. The reference voltage is obtained by a Zener diode 68 to which the circuit power supply voltage VDD is coupled through a resistor 74. Since this embodiment is intended as its object to achieve the functions with a simple and small circuit arrangement, the Zener diode is used, but a reference voltage circuit having a superior temperature characteristic which uses two NMOS transistors each having different Vth may be replaced to enable higher accuracy control. An input control circuit is made up a voltage comparison circuit 73 for comparing a set-up value obtained by the division of the reference voltage by means of resistors 67 and 68 with a voltage obtained by the division of an input signal voltage by means of resistors 69 and 70, and a transistor 60 driven by the voltage comparison circuit 73, and a hysterisis is made by a transistor 72 turned on or off by the operation of a resistor 71 connected in parallel with the resistor 68 and the voltage comparison circuit 73.

In the circuit operative sequence (1), the potential of the ignition input signal is LOW, and since the reference voltage which is the input of the voltage comparison circuit 73 has higher value than that of the ignition input voltage, the output of the voltage comparison circuit 73 is HIGH and since the transistor 60 is conducting the gate voltage of the IGBTs becomes LOW, whereby the primary current does not flow. In the sequence (2), when the input voltage increases and becomes a value over the set-up value obtained by the division the reference voltage by means of the resistors 67 and 68, the output of the voltage comparison circuit 73 becomes LOW, thereby to turn off the transistor 60, whereby the primary current flows by the application of a voltage to the gates of the IGBTs. As soon as the output of the voltage comparison circuit 73 becomes LOW, the transistor 72 turns on, so the set-up value drops because it is divided by the parallel connection of the resistors 70 and 71, and the resistor 67. In the sequence (3), when the input voltage drops and becomes a value below the set-up value obtained by the division of the reference voltage by means of the parallel combination of the resistors 70 and 71 and the resistor 67, the output of the voltage comparison circuit 73 becomes HIGH, and as a result the transistor 60 again turns on the primary current is cut off because the voltage to the gates of the IGBTs becomes LOW. The input stage has an input protection circuit made up resistors 76 and 77, a Zener diode 78 connected in parallel with the resistor 76 and a diode 79 connected toward to the VDD.

A self shut-off function which is a function by which current flowing is forced to be blocked in case where the ignition signal was HIGH over a predetermined period of time, comprises a reference pulse generating circuit, a pulse dividing circuit and a latch circuit. The reference pulse generating circuit comprises a two-input NAND gate 61, a resistor 62, capacitors 65 and 66 and inverters 63 and 64. One input of the two-input NAND gate 61 is coupled to VDD, and the other input is connected to the output of the inverter 64 in a feed-back fashion, and its output is connected to the capacitor 65 through the resistor 62 to charge or discharge electric charge on the capacitor 65. When the output of the NAND gate 61 becomes HIGH, the voltage across the capacitor 65 raises with the time constant defined by the capacitor 65 and the resistor 62, and when it exceeds the threshold of the inverter 63, the inverter 63 becomes LOW and the inverter 64 becomes HIGH. When the output of the inverter 64 becomes HIGH, this HIGH signal is fed back to the input of the NAND gate 61, so that its output becomes LOW. Although at that time the charge on the capacitor 65 raises up with the time constant defined by it and the resistor 62, a large time width is formed by flipping-up the electrical potential of the capacitor 65 through a differential circuit using the capacitor 66. The reference pulse is generated by repeating this. This reference pulse is divided $\times 2^n$ in a counter comprising a division circuit formed by serially connected D flip-flops. The output thereof is LOW while the output signal of the voltage comparison circuit is HIGH, and it is HIGH while the output signal of the voltage comparison circuit 73 is LOW. The latch circuit for holding HIGH at the point of time when this output became HIGH is made up by D flip-flops, this circuit also outputs LOW while the output signal of the voltage comparison circuit 73 is HIGH and operates while the output signal of the voltage comparison circuit 73 is LOW. The time during which the output signal of the voltage comparison circuit 73 is LOW is counted by dividing the reference pulse so that the latch circuit output becomes HIGH in synchronization with the ×$2^n$ divider circuit output, thereby to drop the gate voltage for the IGBTs by making the transistor 60 conductive, whereby the current is cut off. In the sequence (4), when the ignition input signal increases and exceeds the ON threshold voltage, the voltage comparator output of the input control circuit becomes LOW, the IGBT gate control voltage becomes HIGH and further at the same time the division circuit and the latch circuit starts their operation. If some causes beget any extension of the HIGH time of ignition input signal, the ×$2^n$ division circuit outputs HIGH and repeats HIGH-LOW at the ×$2^n$ division period, but once the ×$2^n$ division circuit outputs HIGH, the latch circuit operates to hold it and maintain it until the voltage comparison circuit output becomes HIGH again. With this operation, even though abnormal current flowing in which the HIGH time of the ignition input signal lasts long, it is possible to prevent any damage of the IGBTs by forcing the current to be cut off at the time of the lapse of certain time.

Figure 8:
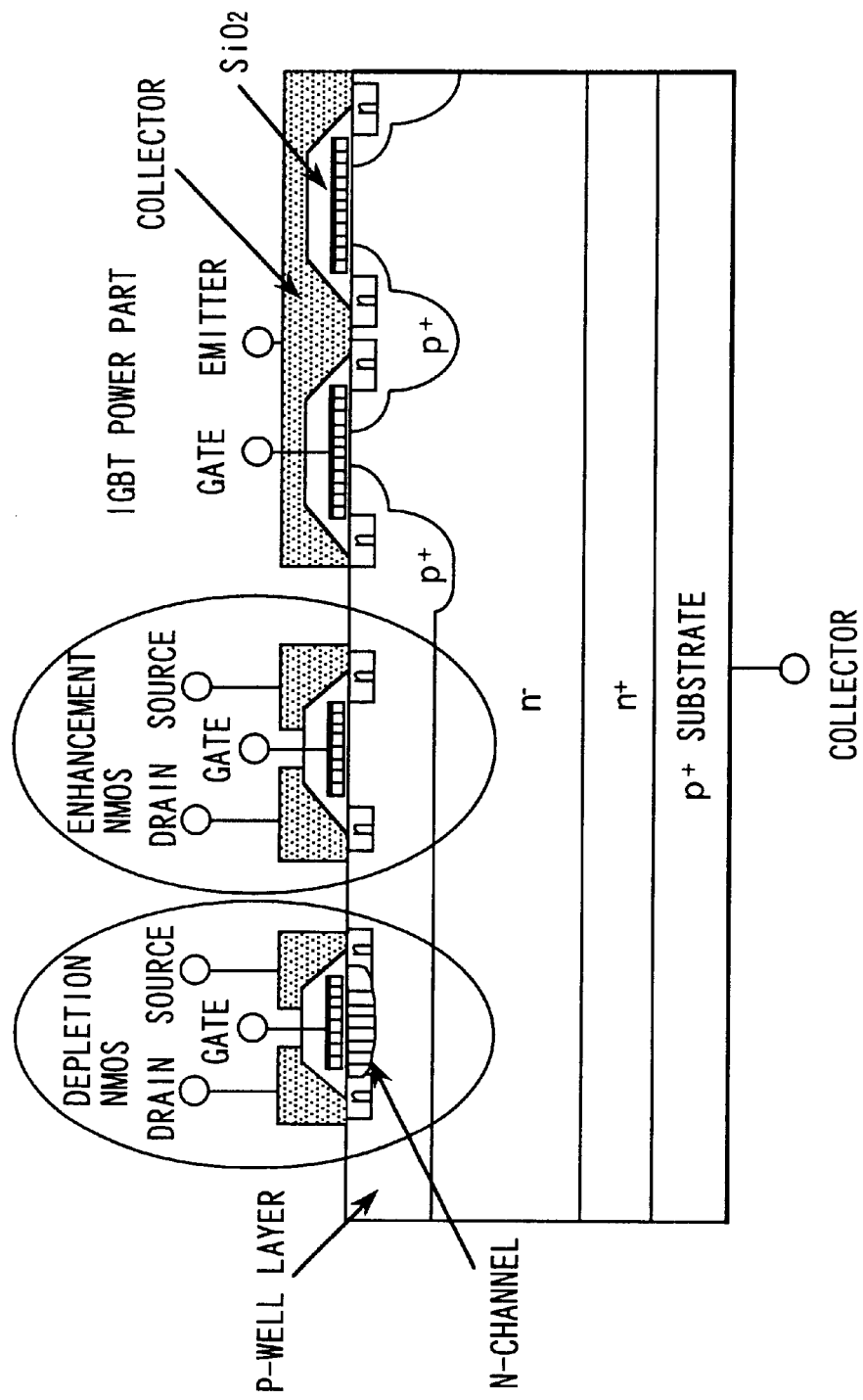
FIG. 8 shows one example of a self-separation type NMOS transistor.

The NMOS transistor carrying out these control functions is made up by a self-separation type NMOS transistor isolated by a p-well layer within an IGBT substrate, and therefore this produces such a merit that the production processes can be simple since the number of masks can be made smaller in comparison with other separation methods such as a dielectric separation method. With this it is possible to provide a low-cost ignition device. FIG. 8 shows an example of the self-separation type NMOS transistor.

Figure 9:
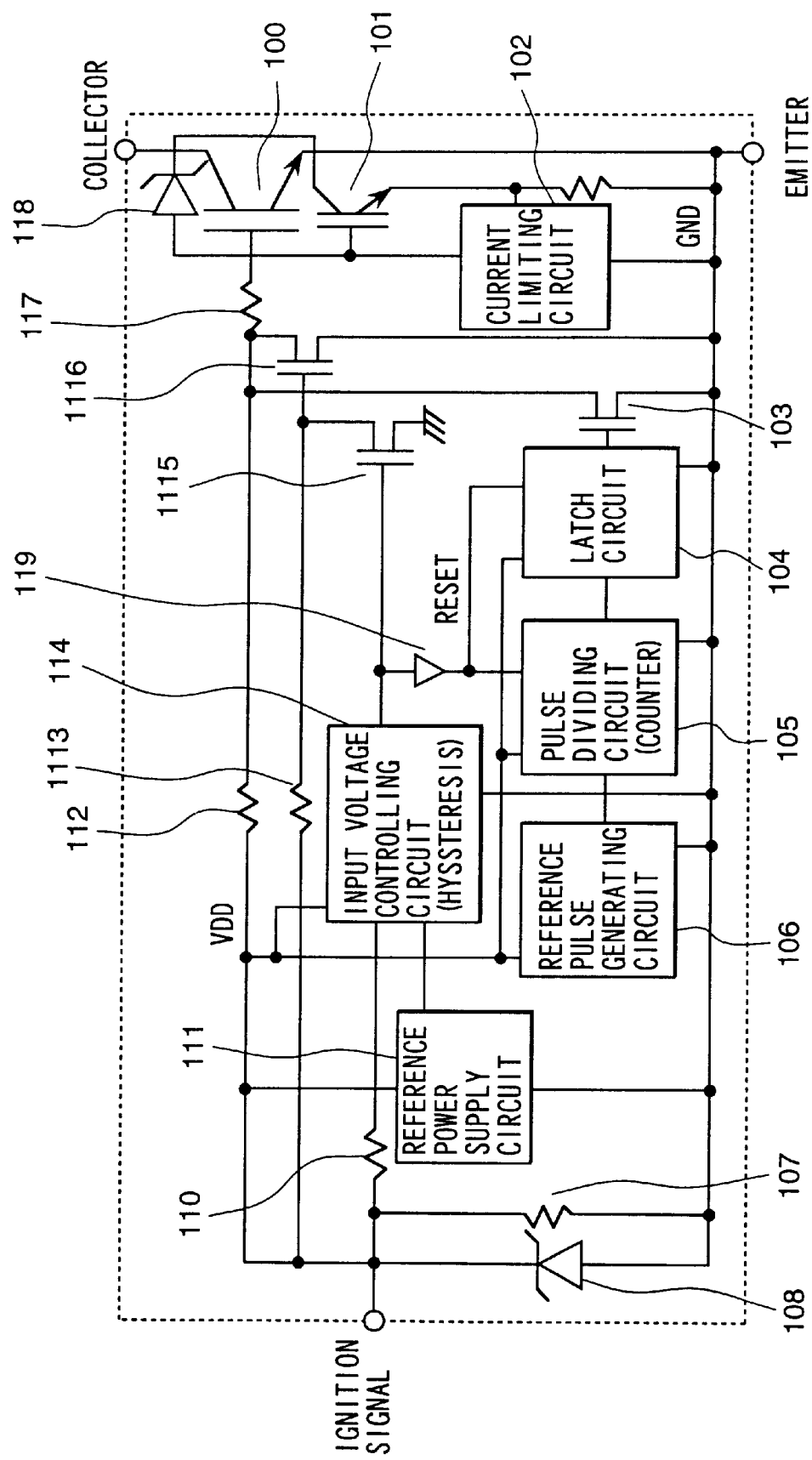
FIG. 9 is a block diagram of an example for a circuit in which there is no battery terminal.

In the case of a system in which the voltage of the ignition input signal is over 3 V, it is possible to utilize as the circuit power supply the voltage of the ignition input signal per se rather than the battery voltage. In this case, since it is possible to ignore the effects of large surges superposing on the battery power supply voltage, a more compact device can be provided for which a protection circuit, etc. is no needed. FIG. 9 shows an embodiment of a multi-function one-chip igniter with no power supply. IGBTs 100 and 101 as basic functional elements, an IGBT protecting Zener diode 118, a current limiting circuit 102, an input voltage limiting circuit 114, a reference power supply circuit 111, a reference pulse generating circuit 106, a pulse division circuit 105, a latch circuit 104, and a Zener diode 108 and resistors 107 and 109 making up an input protection circuit are the same as ones explained in association with the embodiment of claim 1, this is constituted as a system utilizing as the voltage of the ignition input signal rather than the battery voltage. The operation threshold voltage of a transistor 115 is set lower than the operation threshold voltage of the IGBT 100 so that the IBGT turns on by a lower voltage than the voltage at which the IGB always turns on. In this embodiment, since the threshold of the IGBT 100 is set at 1.5 V and the threshold voltage of the transistor 115 is set at 0.5 V, the transistor 115 is conducted when the ignition input signal voltage increases over 0.5 V, thereby to make the gate voltage of the IGBT 100 LOW so that the IGB becomes inoperative. The input voltage control circuit 113 is made up by a voltage comparison circuit having its invert terminal to which the value obtained by the division of the voltage of the reference power supply 110 by means of a resistor 110 is applied, and its non-invert terminal to which the value obtained by the division of the ignition input signal voltage by means of a resistor is applied, and the non-invert voltage is set to a lower voltage than that of the invert voltage by the selection of a voltage division ratio, and the output maintains LOW until the input voltage control circuit certainly operates, whereby the transistor 115 is made conductive to make the IGBT non-conductive the ignition input voltage becomes sufficiently high. When the ignition input signal voltage increases until the voltage at the non-invert terminal becomes over the voltage of the invert terminal, the voltage comparison circuit outputs HIGH to make the transistor 114 conductive to make the transistor 115 off, thereby to supply the gate voltage for the IGBT 100 so that the current flowing condition is provided. A self shut-of circuit for preventing abnormal current flowing is actuated in response to the operation of the pulse division circuit 105 and the latch circuit 104 depending upon the output of the input voltage control circuit.

Figure 5:
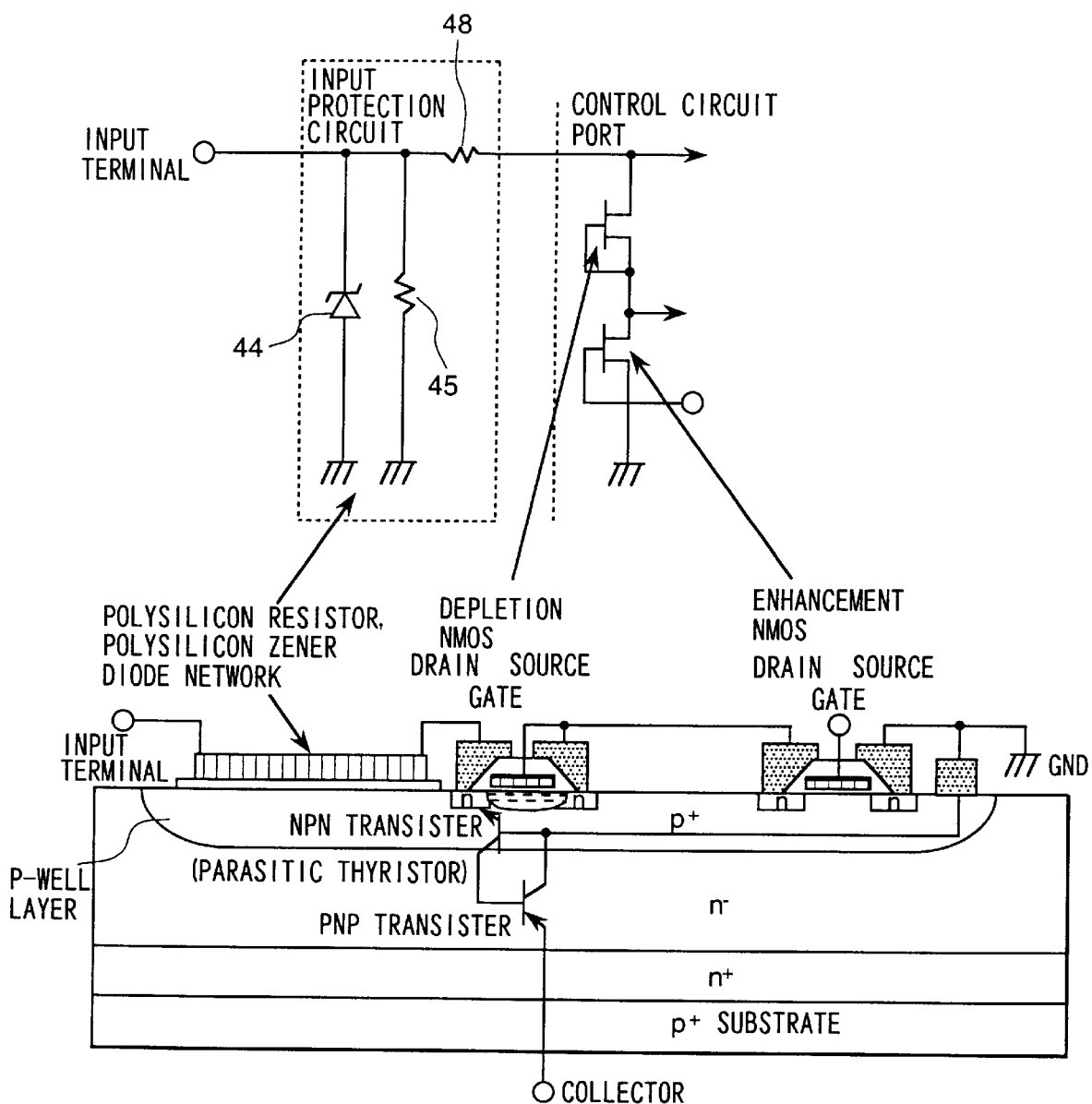
FIG. 5 is a diagram for explaining latch-up resistive amount.

FIG. 5 is an explanatory view for explaining the latch-up withstanding amount. Since the IGPT is an element made up by pnpn of which p-substrate is used as the collector, there is a parasitic thyristor comprising a pnp-transistor and an npn-transistor. In a MOS circuit, it is necessary that the input drain be always maintained at a high voltage since an inverter, etc. having a high resistive load is made in by suspending the drain to the maximum electric potential to minimize the load current. For example, when Vbe of the npn-transistor becomes lower than the GND potential by the application of a negative serge to the input terminal, the thyristor of pnpn conducts so that the latch-up occurs, since the npn transistors conducts and the pnp transistor conducts. In order to prevent this, the Zener voltage of the Zener diode 44 is set up to produce clamping with a higher voltage than that of the ignition control signal outputted from the ECU, and thus for a negative voltage there is not produced the input drain potential under Vbe of the npn-transistor with respect to the GND by the clamping with the voltage drop corresponding to the PN junction forward voltage of silicon, and further since the potential corresponding to the voltage drop by means of the resistor is held it is possible to a sufficient withstanding amount against the latch-up is obtained. It is possible to arrange the network comprising the Zener diode and the resistors 45 and 46 so that a plurality of such networks are serially connected, and this arrangement enables the further increase of the surge withstanding amount.

In accordance with the embodiments of this invention, it is possible to force the primary current to be cut off in case where the ignition control signal having the period longer than the predetermined period was inputted, and also to prevent the elements from any damage even in case where an abnormal current flowing signal is inputted. Also, by causing the operative voltage for the ignition control signal to have a threshold value and a hysterisis, it is possible to provide a margin for external noises, and by arranging these control circuits with NMOS transistors formed within a self-separation layer, it is possible to integrate these on the IGBT monolithic silicon substrate with minimum processes, and whereby it is possible to provide a one-chip igniter with high operative stability and high reliability,

What is claimed is:

1. An ignition device for an internal combustion engine comprising:

a power transistor for controlling a primary current flowing through an ignition coil by its flowing and blocking operation in response to an ignition control signal inputted externally; and an abnormal current flowing prevention circuit for forcing said primary current to be cut off in case where said control signal was inputted representative of current flowing lasting over a predetermined period of time, said abnormal current flowing prevention circuit being integrated on a silicon substrate together with said power transistor, wherein said power transistor is an insulated gate type bipolar transistor, and said circuit is made up by a self-separation type NMOS transistor isolated by a p-well layer within said silicon substrate.

2. An ignition device for an internal combustion engine comprising:

a power transistor for controlling a primary current flowing through an ignition coil by its flowing and blocking operation in response to an ignition control signal inputted externally; and an abnormal current flowing prevention circuit for forcing said primary current to be cut off in case where said control signal was inputted representative of current flowing lasting over a predetermined period of time, said abnormal current flowing prevention circuit being integrated on a silicon substrate together with said power transistor, wherein a Zener diode and a resistor connected in parallel with said Zener diode are included in said ignition control signal input stage, and wherein the Zener voltage of said Zener diode is made over a maximum voltage of said ignition control signal, its direction is such that clumping occurs with a voltage drop corresponding to Vf of the diode.

3. An ignition device for an internal combustion engine comprising:

a power transistor for controlling a primary current flowing through an ignition coil by its flowing and blocking operation in response to an ignition control signal inputted externally; and an abnormal current flowing prevention circuit for forcing said primary current to be cut off in case where said control signal was inputted representative of current flowing lasting over a predetermined period of time, said abnormal current flowing prevention circuit being integrated on a silicon substrate together with said power transistor, wherein said abnormal current flowing prevention circuit comprises a reference pulse generating circuit for detecting that the ignition control signal is inputted over the predetermined period of time, a digital timer made up by a digital counter, and a latch circuit for carrying out latching with the digital timer output signal and dropping a gate voltage of an IGBT to carry out resetting when the ignition control signal is off.

4. An ignition device for an internal combustion engine comprising:

a power transistor for controlling a primary current flowing through an ignition coil by its flowing and blocking operation in response to an ignition control signal inputted externally; and an abnormal current flowing prevention circuit for forcing said primary current to be cut off in case where said control signal was inputted representative of current flowing lasting over a predetermined period of time, said abnormal current flowing prevention circuit being integrated on a silicon substrate together with said power transistor, a current limiting circuit for preventing over-current of said primary current, said current limiting circuit being integrated on said silicon substrate, an input control for controlling said power transistor in response to said ignition control signal inputted, said input control circuit being integrated on said silicon substrate, of which control system supplies said ignition control signal of which voltage is over 3 V with respect to ground, wherein the power supply is supplied from said ignition control signal, and the current flowing threshold value for said ignition control signal is less than 3 V.

5. A one-chip type ignition device for an internal combustion engine comprising:

an insulated gate type bipolar power transistor by which a high voltage is generated at a secondary side of an ignition coil by a flowing and blocking control of primary current through the ignition coil in response to a control signal outputted from an internal combustion engine electronic control apparatus;

an input control circuit having a threshold value and a hysterisis, for controlling a gate voltage of said insulated gate type bipolar power transistor in response to said control signal inputted;

a current limiting circuit for preventing the over-current of said primary current; and an abnormal current flowing prevention circuit for forcing the primary current to be blocked in case where said control signal was inputted representative of the current flowing over a predetermined period of time; and wherein said insulated gate type bipolar power transistor, said input control circuit, said current limiting circuit, and said abnormal current flowing protection circuit are integrated on a silicon substrate, said control circuit is made up by a self-separation type NiVIOS transistor isolated by a p-well layer within said silicon substrate.

6. A one-chip type ignition device for an internal combustion engine comprising:

an insulated gate type bipolar power transistor by which a high voltage is generated at a secondary side of an ignition coil by a flowing and blocking control of primary current through the ignition coil in response to a control signal outputted from an internal combustion engine electronic control apparatus;

an input control circuit having a threshold value and a hysterisis, for controlling a gate voltage of said insulated gate type bipolar power transistor in response to said control signal inputted;

a current limiting circuit for preventing the over-current of said primary current; and an abnormal current flowing prevention circuit for forcing the primary current to be blocked in case where said control signal was inputted representative of the current flowing over a predetermined period of time; and wherein said insulated gate type bipolar power transistor, said input control circuit, said current limiting circuit, and said abnormal current flowing protection circuit are integrated on a silicon substrate, wherein a Zener diode and a resistor connected in parallel with said Zener diode are included in said ignition control signal input stage, and wherein a Zener voltage of said Zener diode is made over a maximum voltage of said ignition control signal, its direction is such that clumping occurs with a voltage drop corresponding to Vf of the diode.

7. A one-chip type ignition device for an internal combustion engine comprising:

an insulated gate type bipolar power transistor by which a high voltage is generated at a secondary side of an ignition coil by a flowing and blocking control of primary current through the ignition coil in response to a control signal outputted from an internal combustion engine electronic control apparatus;

an input control circuit having a threshold value and a hysterisis, for controlling a gate voltage of said insulated gate type bipolar power transistor in response to said control signal inputted;

a current limiting circuit for preventing the over-current of said primary current; and an abnormal current flowing prevention circuit for forcing the primary current to be blocked in case where said control signal was inputted representative of the current flowing over a predetermined period of time; and wherein said insulated gate type bipolar power transistor, said input control circuit, said current limiting circuit, and said abnormal current flowing protection circuit are integrated on a silicon substrate, wherein said abnormal current flowing prevention circuit comprises a reference pulse generating circuit for detecting that the ignition control signal is inputted over the predetermined period of time, a digital timer made up by a digital counter, and a latch circuit for carrying out latching with the digital timer output signal and dropping the gate voltage of an IGBT to carry out resetting when the ignition control signal is off.

8. A one-chip type ignition device for an internal combustion engine comprising:

an insulated gate type bipolar power transistor by which a high voltage is generated at a secondary side of an ignition coil by a flowing and blocking control of primary current through the ignition coil in response to a control signal outputted from an internal combustion engine electronic control apparatus;

an input control circuit having a threshold value and a hysterisis, for controlling a gate voltage of said insulated gate type bipolar power transistor in response to said control signal inputted;

a current limiting circuit for preventing the over-current of said primary current; and an abnormal current flowing prevention circuit for forcing the primary current to be blocked in case where said control signal was inputted representative of the current flowing over a predetermined period of time; and wherein said insulated gate type bipolar power transistor, said input control circuit, said current limiting circuit, and said abnormal current flowing protection circuit are integrated on a silicon substrate, of which control system supplies said ignition control signal of which voltage is over 3 V with respect to ground, wherein the power supply is supplied from said ignition control signal, and the current flowing threshold value for said ignition control signal is less than 3 V.

* * * * *